(12) United States Patent
McBrien et al.

(10) Patent No.: US 11,047,920 B2
(45) Date of Patent: Jun. 29, 2021

(54) SENSOR TO SENSOR SHORT DETECTION

(71) Applicant: Hamilton Sundstrand Corporation, Charlotte, NC (US)

(72) Inventors: Gary M. McBrien, South Glastonbury, CT (US); James A. Gosse, Storrs, CT (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 154 days.

(21) Appl. No.: 16/373,182

(22) Filed: Apr. 2, 2019

(65) Prior Publication Data
US 2020/0319239 A1    Oct. 8, 2020

(51) Int. Cl.
G01R 31/00    (2006.01)
G01R 31/50    (2020.01)
G01K 15/00    (2006.01)

(52) U.S. Cl.
CPC .......... *G01R 31/50* (2020.01); *G01K 15/007* (2013.01)

(58) Field of Classification Search
CPC ...... G01K 15/007; G01K 15/005; G01K 7/04; G01K 7/02; G01K 15/00; G01K 7/026; G01R 31/2829; G01R 31/52; G01R 31/50; G01R 31/28; B64D 45/00; B64F 5/60
See application file for complete search history.

(56) References Cited

U.S. PATENT DOCUMENTS

| | | | |
|---|---|---|---|
| 3,755,688 A * | 8/1973 | Hohler | H02H 5/10 307/117 |
| 4,166,243 A * | 8/1979 | West | G01R 31/54 324/537 |
| 4,496,250 A * | 1/1985 | Walsh | G01R 31/50 374/186 |
| 4,868,506 A | 9/1989 | Distefano et al. | |
| 5,418,464 A * | 5/1995 | Swift | G01K 7/026 324/537 |
| 5,726,564 A * | 3/1998 | Takashima | G01R 17/105 323/367 |
| 7,271,595 B2 | 9/2007 | Shimizu et al. | |

(Continued)

FOREIGN PATENT DOCUMENTS

| EP | 3385681 A1 | 10/2018 |
|---|---|---|
| GB | 2498370 A | 7/2013 |
| NL | 1018226 C1 | 6/2001 |

OTHER PUBLICATIONS

European Search Report for Application No. 19211568.1, dated Jun. 25, 2020, 66 pages.

*Primary Examiner* — Vinh P Nguyen
(74) *Attorney, Agent, or Firm* — Cantor Colburn LLP

(57) ABSTRACT

Disclosed is a short detection system for an aircraft. The system includes a pair of alternating current sources defined by respective frequencies being offset by a predetermined value. The system includes a pair of sensor systems including respective measurement circuits coupled to respective sensor apparatuses to measure at least one parameter of an environment. The system includes an alternating current measurement system that includes a low pass filter having a cutoff frequency greater than the predetermined value such that a beat indicative of a difference between the respective frequencies passed through the pair of sensor systems is isolated by the low pass filter. The system indicates a short among the pair of sensor systems when the beat is present.

17 Claims, 4 Drawing Sheets

(56) References Cited

U.S. PATENT DOCUMENTS

| | | | |
|---|---|---|---|
| 8,922,221 B2 * | 12/2014 | Lacombe | G01R 31/2829 |
| | | | 324/509 |
| 9,823,154 B2 * | 11/2017 | Norris | G01R 31/50 |
| 2014/0145728 A1 | 5/2014 | Lacombe et al. | |

* cited by examiner

SENSOR TO SENSOR SHORT DETECTION

BACKGROUND

Exemplary embodiments pertain to the art of short detection for sensors of aircraft. Sensors are prone to measurement failure or measurement accuracy reduction. One such measurement condition may include a short between two sensors having proximate measurement circuits or loops. Short conditions may not always be conspicuous. For example, these common mode failures may provide similar operator indications among common indication channels that elude detection.

BRIEF DESCRIPTION

Disclosed is a short detection system for an aircraft. The system includes a pair of alternating current sources defined by respective frequencies being offset by a predetermined value. The system includes a pair of sensor systems including respective measurement circuits coupled to respective sensor apparatuses to measure at least one parameter of an environment. The system includes an alternating current measurement system that includes a low pass filter having a cutoff frequency greater than the predetermined value such that a beat indicative of a difference between the respective frequencies passed through the pair of sensor systems is isolated by the low pass filter. The system indicates a short among the pair of sensor systems when the beat is present.

In addition to one or more of the features described above, or as an alternative, further embodiments may include that the alternating current sources are reduced by a capacitor before passing through the sensor system.

In addition to one or more of the features described above, or as an alternative, further embodiments may include that the sensor apparatuses are thermocouples.

In addition to one or more of the features described above, or as an alternative, further embodiments may include that the predetermined value is an order of magnitude less than a frequency of a one of the pair of alternating current sources.

In addition to one or more of the features described above, or as an alternative, further embodiments may include that the alternating current measurement system further includes a rectifier circuit disposed to rectify the alternating current.

In addition to one or more of the features described above, or as an alternative, further embodiments may include that the indication is issued when a maximum magnitude of the rectified alternating current is greater than the predetermined value.

Also disclosed is short detection system for an aircraft. The system includes a pair of alternating current sources having respective frequencies being offset by a predetermined value. The system includes a pair of sensor systems including respective measurement circuits coupled to respective sensor apparatuses to measure at least one parameter of an environment. The system includes an alternating current measurement system that includes a frequency isolation system that isolates the predetermined value from an interference alternating current corresponding to the pair of alternating current sources having passed through the pair of sensor systems. The system indicates a short among the pair of sensor systems when the predetermined value is detected.

In addition to one or more of the features described above, or as an alternative, further embodiments may include that the frequency isolation system includes a low pass filter.

In addition to one or more of the features described above, or as an alternative, further embodiments may include that the alternating current sources are reduced by a capacitor before passing through the sensor system.

In addition to one or more of the features described above, or as an alternative, further embodiments may include that the sensor apparatuses are thermocouples.

In addition to one or more of the features described above, or as an alternative, further embodiments may include that the predetermined value is an order of magnitude less than a frequency of a one of the pair of alternating current sources.

In addition to one or more of the features described above, or as an alternative, further embodiments may include that the alternating current measurement system further includes a rectifier circuit disposed to rectify the alternating current.

In addition to one or more of the features described above, or as an alternative, further embodiments may include that the indication is issued when a maximum magnitude of the rectified alternating current is greater than a predetermined magnitude.

Also disclosed is a method of detecting a short in an aircraft sensor system. The method includes driving alternating currents having respective frequencies being offset by a predetermined value through sensor systems including respective sensor apparatuses to measure at least one parameter of an environment and a measurement circuit coupled to the sensor apparatuses. The method includes detecting presence of an interference signal comprising a combination of the alternating currents including a beat waveform defined by the offset of respective frequencies. The method includes indicating a short among sensor systems when the beat is present. The method includes operating an aircraft according to the indication.

In addition to one or more of the features described above, or as an alternative, further embodiments may include reducing the alternating current by a capacitor before entering the sensor system.

In addition to one or more of the features described above, or as an alternative, further embodiments may include rectifying the interference signal and smoothing the rectified interference signal.

In addition to one or more of the features described above, or as an alternative, further embodiments may include that the indication is based on the rectified and smoothed interference signal exceeding a predetermined threshold based on the predetermined value.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Sensor apparatuses may be used to determine various environmental parameters. For example, thermocouples and resistance temperature devices (RTD) may be used to measure a temperature of the environment. Differential pressure devices may be used to measure pressure, fluid flow, or fluid levels. Linear variable differential transformers may be used to measure position.

Sensor apparatuses are associated with sensor or instrument channels configured to provide parameter indication to operators and control systems. Channels may be redundantly disposed such that numerous instruments measure similar parameters and provide indications within the same conduits and locations. Common cause faults can occur where sensor channels short together, providing the same or erroneous indication.

An application of alternating current having unique frequencies through portions of the measurement circuit and sensor apparatuses may non-intrusively provide indication of the shorted channels. Indeed, the short may induce interference waveforms or combination waveforms that would flow through one of the channels. The interference waveforms may have beat frequencies that, when isolated, provide an indication of the short. The beat frequencies may further be used to identify combinations of sensors implicated with a short circuit condition.

Figure 1:
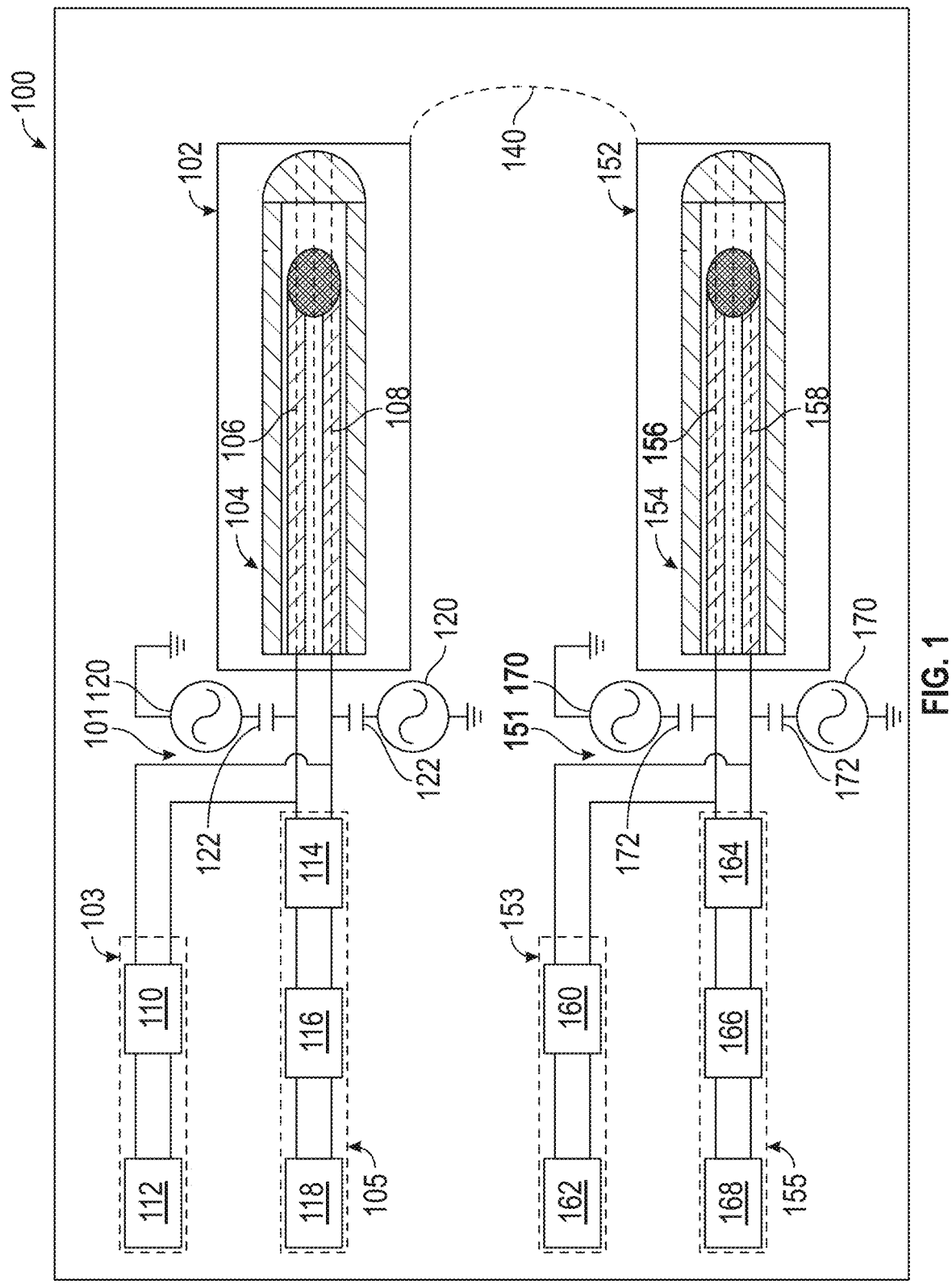
FIG. 1 is an aircraft sensor fault detection system having an alternating current source.

Referring to FIG. 1, an aircraft 100, is shown. The aircraft 100 includes a sensor systems 101, 151. The sensor system 101 includes a sensor apparatus 102. The sensor apparatus 102 may be a thermocouple 104 or any other type of sensor, or portion thereof, discussed or not discussed throughout this disclosure. As shown, the thermocouple 104 has disparate conductors 106, 108 defining a portion of a measurement circuit 103 connected measurement instrumentation 110, 112 such that a voltage generated by the disparate conductors 106, 108 is measured by the measurement instrumentation 110, 112. The measurement circuit may include at least the sensor apparatus 102, and the measurement instrumentation 110, 112. The disparate conductors 106, 108 generate a voltage based on a temperature of the environment of the aircraft 100. The environment may be any enclosed or open area having parameters that can be sensed. The parameter may be any property that can be determined based on the sensor apparatus 102. As a brief example, the parameter may be temperature, pressure, mass, weight, position, or velocity.

A source of alternating current 120 may be connected to the sensor system 101. The source of alternating current 120 may be configured to flow through the sensor apparatus 102 and the rest of measurement circuit 103, or a portion thereof. For example, the alternating current may be connected in parallel such that alternating current flows through the sensor to the alternating current measurement system. The alternating current 120 may be reduced by a capacitor 122 such that a trickle alternating current is formed. The trickle alternating current may impose less measurement error than the full alternating current 120. To filter the alternating current 120 from the measurement circuit 103, a low-pass filter 110 may be implemented. The low-pass filter 110 ensures that only direct current or pseudo direct current reaches the measurement instrumentation 112. The low pass filter 110 may be, for example, a choke. That is, only direct current provided by the thermocouple 104 or amplification thereof is measured by the measurement instrumentation 112.

A similar second sensor system 151 includes a sensor apparatus 152. The sensor apparatus 152 may be a thermocouple 154 or any other type of sensor, or portion thereof, discussed or not discussed throughout this disclosure. As shown, the thermocouple 154 has disparate conductors 156, 158 defining a portion of a measurement circuit 153 connected measurement instrumentation 160, 162 such that a voltage generated by the disparate conductors 156 is measured by the measurement instrumentation 160, 162. The measurement circuit may include at least the sensor apparatus 152, and the measurement instrumentation 160, 162. The disparate conductors 156, 158 generate a voltage based on a temperature of the environment of the aircraft 100. The environment may be any enclosed or open area having parameters that can be sensed. The parameter may be any property that can be determined based on the sensor apparatus 152. As a brief example, the parameter may be temperature, pressure, mass, weight, position, or velocity.

A source of alternating current 170 may be connected to the sensor system 151. The source of alternating current 170 may be configured to flow through the sensor apparatus 152 and the rest of measurement circuit 153, or a portion thereof. For example, the alternating current may be connected in parallel such that alternating current flows through the sensor to the alternating current measurement system. The alternating current 170 may be reduced by a capacitor 172 such that a trickle alternating current is formed. The trickle alternating current may impose less measurement error than the full alternating current 170. To filter the alternating current 170 from the measurement circuit 153, a low-pass filter 160 may be implemented. The low-pass filter 160 ensures that only direct current or pseudo direct current reaches the measurement instrumentation 162. The low pass filter 110 may be, for example, a choke. That is, only direct current provided by the thermocouple 104 or amplification thereof is measured by the measurement instrumentation 162.

A short 140 between the sensor systems 101, 151 may cause an interference waveform to be generated as a combination of the alternating current from sources 120, 170. Although shown between the sensor apparatuses 102, 152, the short 140 may occur at any location that the alternating currents 120, 170 traverse. For example, the short 140 may occur along portions of the measurement circuits 103, 153. Because the alternating current sources 120, 170 have disparate frequencies that are offset or different by a predetermined value, the interference waveform created by the short 140 may include a beat that is equal to the predetermined value. That is, the beat frequency of the interference is equal to the difference between the two originating waveforms from alternating current sources 120, 170. The predetermined value (e.g., 10 Hz) is an order of magnitude less than a frequency of a one of the pair of alternating current sources.

An alternating current measurement system 105, 155 may detect the beat frequency. The beat may be isolated by an envelope detector or another implement. For example, a low-pass filter 114, 164 may be used. The low-pass filter may be used in conjunction with a precision rectifier or rectifying diode. Additionally, an envelope demodulator circuit may be used. Any type of circuit design that isolates, identifies, or improves identification of the envelope is disclosed herein. An additional rectifier 116, 166 may be further used to convert the envelope or beat signal into direct current form for comparison at the comparator 118, 168. It should be appreciated that any number of beat frequencies may be isolated from any pair of sensors having circuits traversing the same conduit. That is, each measurement circuit in addition to the measurement circuits 103, 153 shown may have offset alternating current sources such that any short between any of the sources would provide a unique beat frequency to the alternating current measurement system 105, 155. As such, the alternating current measurement system 105, 155 or additional alternating current measurement systems could determine the exact pair of devices that was shorted based on the beat frequency or envelope frequency as isolated.

After isolation by the isolation device, envelope detector, or low-pass filter 114, the alternating current measurement system may be configured to rectify and smooth the alternating current by a rectification and smoothing circuit 116. For example, a full-wave rectifier may be implemented with a capacitor to convert the alternating current to direct current. Other types of rectifiers may be used (e.g., half-wave) and adjustments to the indication thresholds of the comparator 118 may be adjusted commensurately. The thresholds may be set based on a maximum magnitude of the rectified and smoothed alternating current 120. For example, the threshold may be based on a peak value, root mean squared value, or saddle value if the smoothing does not remove all of the oscillations from the source of alternating current 120.

The comparator 118, 168 may compare the rectified direct current with a predetermined threshold based on the difference in frequencies of the alternating current sources 120, 170. For example, a voltage associated with the rectified direct current is compared with a voltage associated with the difference through evaluation and testing. If the voltage is within the particular band or exceeds a threshold, an error indicating the short 140 is indicated. It should be appreciated that any or all of the portions described herein may be implemented in a microcontroller or computer system such that indication is provided For example, the interference wave form may be received by a computer, controller, or processor, configured to isolate the beat waveform.

Figure 2A:
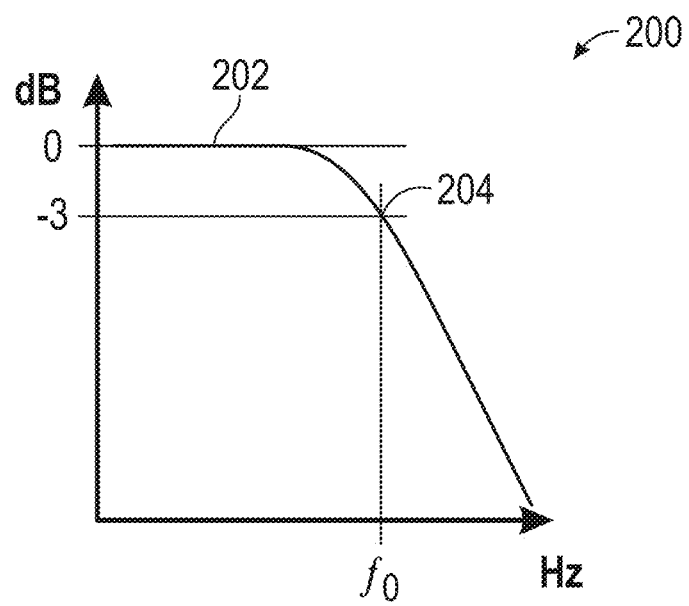
FIG. 2A is a Bode plot of frequency response for a low pass frequency filter.
Figure 2B:
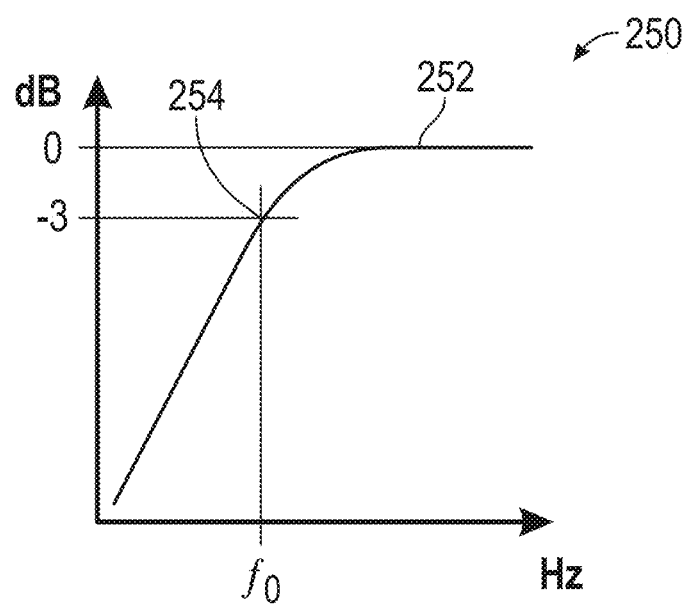
FIG. 2B is a Bode plot of frequency response for a high pass frequency filter.

Referring to FIGS. 2A-2B, Bode plots 200, 250 showing frequency response for respective low pass and high pass frequency filters are shown. Bode plot 200 includes a contour 202 of allowed frequencies in Hz along the horizontal axis. The Bode plot 200 shows power reduction of −3 dB at the corner or cutoff frequency 204 along the vertical axis. The cutoff frequency 204 is the division between the pass frequencies and the stop frequencies. The cutoff frequency for the low pass frequency filter as shown in Bode plot 200 could be 1 Hz. Bode plot 250 includes a contour 252 of allowed frequencies in Hz along the horizontal axis. The Bode plot 200 shows power reduction of −3 dB at the corner or cutoff frequency 254 along the vertical axis. The cutoff frequency for the high pass frequency filter as shown in Bode plot 250 could similarly be 1 Hz. The pass frequency may also be a band (not shown) as a concave combination of the high pass and low pass frequency filters.

Figure 3:
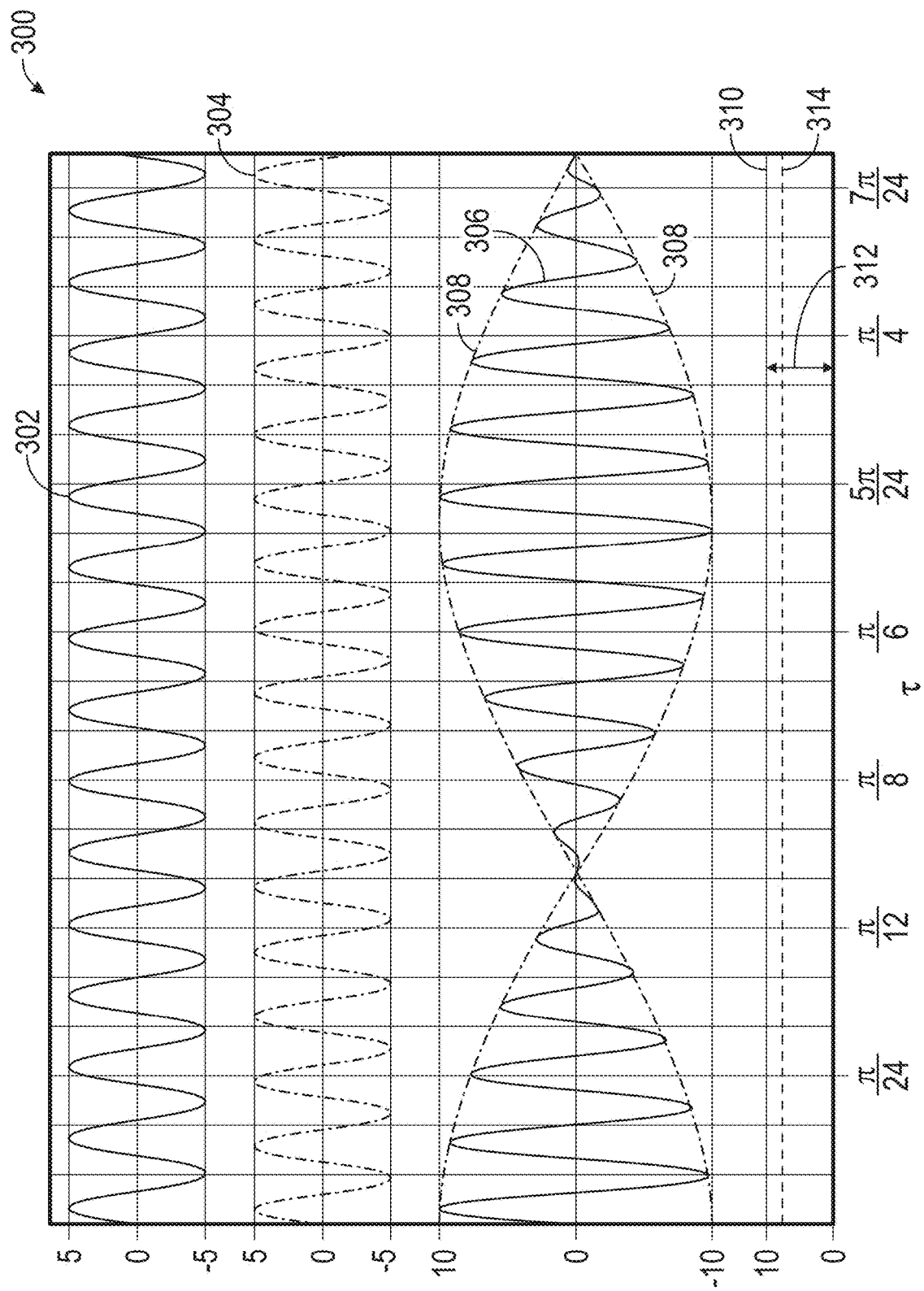
FIG. 3 is a multiwave form graph including alternating waveforms, interference alternating waveforms, and a beat waveform.

Referring to FIG. 3, a signal plot 300 is shown. 100.00 kHz waveform 302 generated from alternating current source 120 is shown. 100.01 kHz waveform 304 generated from alternating current source 170 is shown. It should be appreciated that the frequency of these waveforms may be changed and adjusted based on a variety of factors not limited to the sensor apparatus used, environment of installation, and other use conditions.

As discussed, the short 140 caused the interference waveform 306 to be generated. The interference waveform or signal 306 is a combination of the frequencies for waveforms 302, 304. The difference in frequencies of the waveforms 302, 304 causes an envelope or beat waveform 308 to be created having a frequency of the difference between waveforms 302, 304, specifically 10 Hz. The beat waveform 306 is defined by an envelope of the outer bounds of the waveform. Indeed, this beat waveform 306 can be isolated by the alternating current measurement systems 105, 155 to recognize the short condition between the sensor systems 101, 151.

After rectification, the beat waveform 306 is smoothed to a direct current 310 having a magnitude 312. It should be appreciated that the magnitude 312 may be a maximum magnitude based on minor undulations difficult to remove by smoothing. The presence of this direct current is indicative that a beat waveform 306 is received by one of the alternating current measurement systems 105, 155. As such, if this magnitude exceeds a deadband threshold 314, the comparator 168 may issue indication of the short 140.

Figure 4:
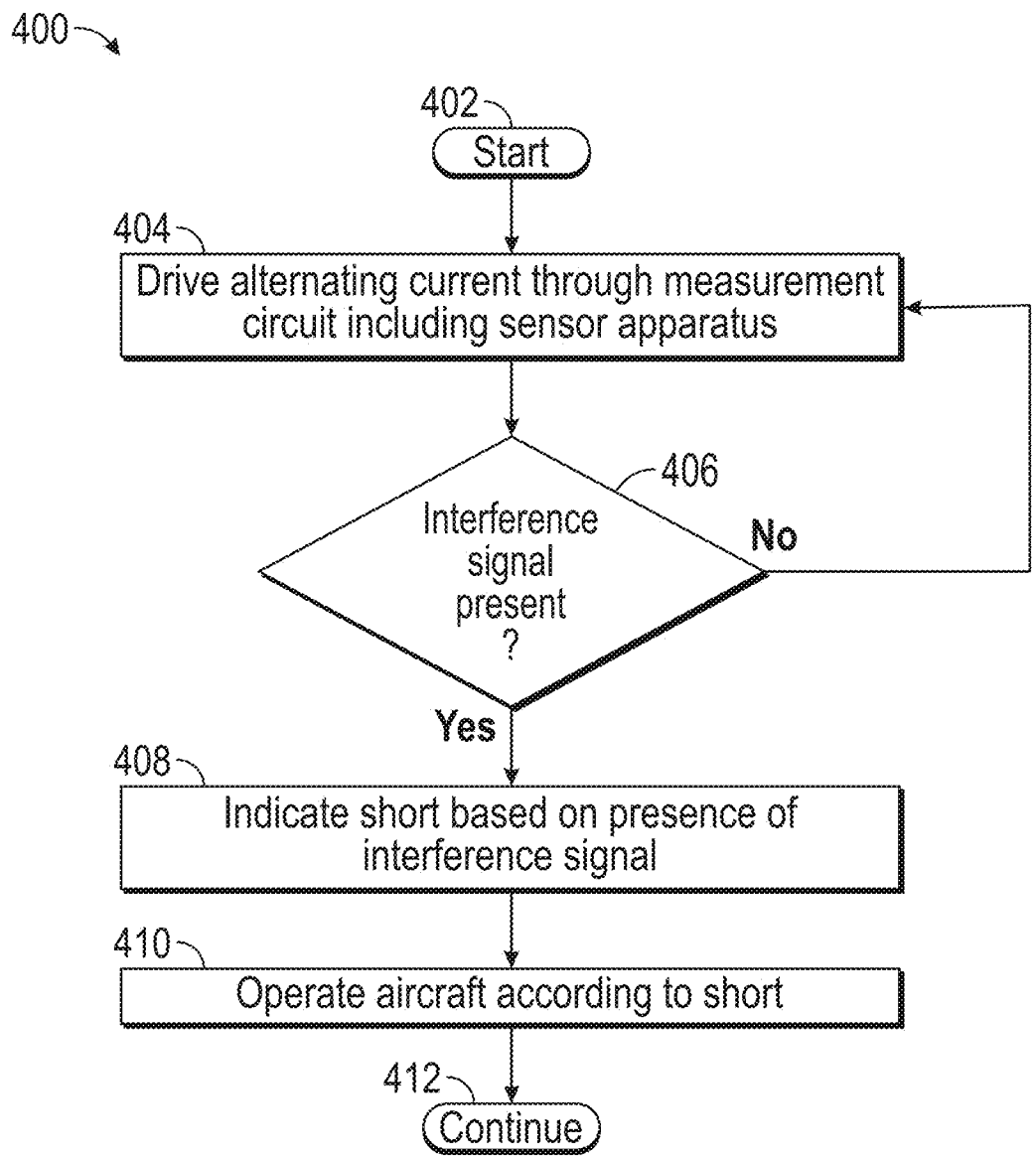
FIG. 4 is an algorithm for detecting a short based on an interference signal.

Referring to FIG. 4, an algorithm 400 is shown. The algorithm 400 starts in step 402. In step 404 the alternating current sources 120, 170 drive alternating current through portions of the measurement circuit 103, 153. The portions may include the sensor apparatus 102, 152. The sensor apparatus 102, 152 and portions of the measurement circuit 103, 153 may be disposed in an environment of an aircraft to measure a parameter of the environment. In step 406, an interference waveform 306 is either detected or not detected. The detection may be provided by low-pass filter, beat detector, envelope detector, resistor-capacitor circuit, or any combination thereof. The detection may also include rectification of the envelope or beat waveform 308. A comparator 118, 168 may be used to determine whether the rectified signal 310 is more than noise. The beat waveform 306 may be defined by the frequency offset of the alternating current sources 120, 170.

In step 408, the algorithm may include indicating the short 140 among the sensor systems 101, 151 to the aircraft or an operator of the aircraft. For example, the alternating current measurement system 105, 155, may output a digital output to signify the presence of the short 140. The output may include operating the aircraft 100 according to the short 140. The operation may be performed by an operator or control system of the aircraft 100. In step 412, the algorithm 400 ends or repeats. It should be appreciated that any of the aforementioned steps may be omitted, repeated, or rearranged as necessary. Some of the steps may be performed by a controller or computing system. As such, the computing system may be configured with any type of programming language, embedded circuit, integrated circuit, logic system, or combination thereof.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A short detection system for an aircraft, the system comprising:
    a pair of alternating current sources defined by respective frequencies being offset by a predetermined value;
    a pair of sensor systems including respective measurement circuits coupled to respective sensor apparatuses to measure at least one parameter of an environment; and
    an alternating current measurement system that:
        includes a low pass filter having a cutoff frequency greater than the predetermined value such that a beat indicative of a difference between the respective frequencies passed through the pair of sensor systems is isolated by the low pass filter; and
        provides an indication of a short among the pair of sensor systems when the beat is present.

2. The short detection system of claim 1, wherein the alternating current sources are reduced by a capacitor before passing through the sensor system.

3. The short detection system of claim 1, wherein the sensor apparatuses are thermocouples.

4. The short detection system of claim 1, wherein the predetermined value is an order of magnitude less than a frequency of a one of the pair of alternating current sources.

5. The short detection system of claim 1, wherein the alternating current measurement system further includes a rectifier circuit disposed to rectify an alternating current.

6. The short detection system of claim 5, wherein the indication is issued when a maximum magnitude of the rectified alternating current is greater than the predetermined value.

7. A short detection system for an aircraft, the system comprising:
    a pair of alternating current sources having respective frequencies being offset by a predetermined value;
    a pair of sensor systems including respective measurement circuits coupled to respective sensor apparatuses to measure at least one parameter of an environment; and
    an alternating current measurement system that
        includes a frequency isolation system that isolates the predetermined value from an interference alternating current corresponding to the pair of alternating current sources having passed through the pair of sensor systems, and
        provides an indication of a short among the pair of sensor systems when the predetermined value is detected.

8. The system of claim 7, wherein the frequency isolation system includes a low pass filter.

9. The short detection system of claim 7, wherein the alternating current sources are reduced by a capacitor before passing through the sensor system.

10. The short detection system of claim 7, wherein the sensor apparatuses are thermocouples.

11. The short detection system of claim 7, wherein the predetermined value is an order of magnitude less than a frequency of a one of the pair of alternating current sources.

12. The short detection system of claim 7, wherein the alternating current measurement system further includes a rectifier circuit disposed to rectify an alternating current.

13. The short detection system of claim 12, wherein the indication is issued when a maximum magnitude of the rectified alternating current is greater than a predetermined magnitude.

14. A method of detecting a short in an aircraft, the method comprising:
    driving alternating currents having respective frequencies being offset by a predetermined value through sensor systems including respective sensor apparatuses to measure at least one parameter of an environment and a measurement circuit coupled to the sensor apparatuses;
    detecting presence of an interference signal comprising a combination of the alternating currents including a beat waveform defined by the offset of respective frequencies;
    indicating a short among the sensor systems when the beat is present; and
    operating an aircraft according to the indication.

15. The method of claim 14 further comprising, reducing the alternating current by a capacitor before entering the sensor system.

16. The method of claim 14 further comprising, rectifying the interference signal and smoothing the rectified interference signal.

17. The method of claim 16, wherein the indication is based on the rectified and smoothed interference signal exceeding a predetermined threshold based on the predetermined value.

* * * * *